US012700454B2

(12) United States Patent
Nien et al.

(10) Patent No.: US 12,700,454 B2
(45) Date of Patent: Aug. 4, 2026

(54) FLY SHARED BIT LINE ON 4-CPP STATIC RANDOM ACCESS MEMORY (SRAM) CELL AND ARRAY

(71) Applicant: Taiwan Semiconductor Manufacturing Company, Ltd., Hsinchu (TW)

(72) Inventors: Yi-Hsin Nien, Hsinchu (TW); Chih-Yu Lin, Hsinchu (TW); Hidehiro Fujiwara, Hsinchu (TW); Yen-Huei Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 328 days.

(21) Appl. No.: 18/328,095

(22) Filed: Jun. 2, 2023

(65) Prior Publication Data
US 2024/0404588 A1     Dec. 5, 2024

(51) Int. Cl.
*G11C 11/419*     (2006.01)
*H10B 10/00*     (2023.01)

(52) U.S. Cl.
CPC ............ *G11C 11/419* (2013.01); *H10B 10/12* (2023.02); *H10B 10/18* (2023.02)

(58) Field of Classification Search
CPC ..... G11C 11/418; G11C 11/419; H10B 10/12; H10B 10/18
USPC .......................................................... 365/154
See application file for complete search history.

(56) References Cited

U.S. PATENT DOCUMENTS

| | | | | |
|---|---|---|---|---|
| 10,460,794 B1 * | 10/2019 | Liaw | ..................... | H10B 10/12 |
| 2019/0065151 A1 * | 2/2019 | Chen | ..................... | G06F 17/16 |
| 2023/0070119 A1 * | 3/2023 | Lue | ..................... | H10B 10/125 |
| 2023/0123487 A1 | 4/2023 | Smith et al. | | |
| 2023/0290387 A1 * | 9/2023 | Raj | ......................... | G11C 5/025 |
| 2023/0402069 A1 * | 12/2023 | Kolar | .................. | G11C 7/1012 |
| 2023/0420017 A1 * | 12/2023 | Kolar | ................. | G11C 11/4096 |

FOREIGN PATENT DOCUMENTS

| | | |
|---|---|---|
| CN | 114725109 A | 7/2022 |
| EP | 3 945 580 A1 | 2/2022 |
| JP | 2011-243258 A | 12/2011 |
| TW | 202115874 A | 4/2021 |

OTHER PUBLICATIONS

Office Action issued in connection with Taiwan Appl. No. 112138622 dated Jul. 29, 2024.

* cited by examiner

*Primary Examiner* — Sung Il Cho
(74) *Attorney, Agent, or Firm* — Foley & Lardner LLP

(57) ABSTRACT
A semiconductor device includes a first memory cell, a second memory cell, a third memory cell, and a fourth memory cell operatively arranged along a first one of a plurality of columns, and operatively arranged in a first one, a second one, a third one, and a fourth one of a plurality of rows, respectively. The first column operatively corresponds to a first pair of bit lines and a second pair of bit lines. The first to fourth rows operatively correspond to a first word line, a second word line, a third word line, and a fourth word line, respectively. The first pair of bit lines are operatively coupled to the first and second memory cells. The second pair of bit lines are operatively coupled to the third and fourth memory cells.

20 Claims, 9 Drawing Sheets

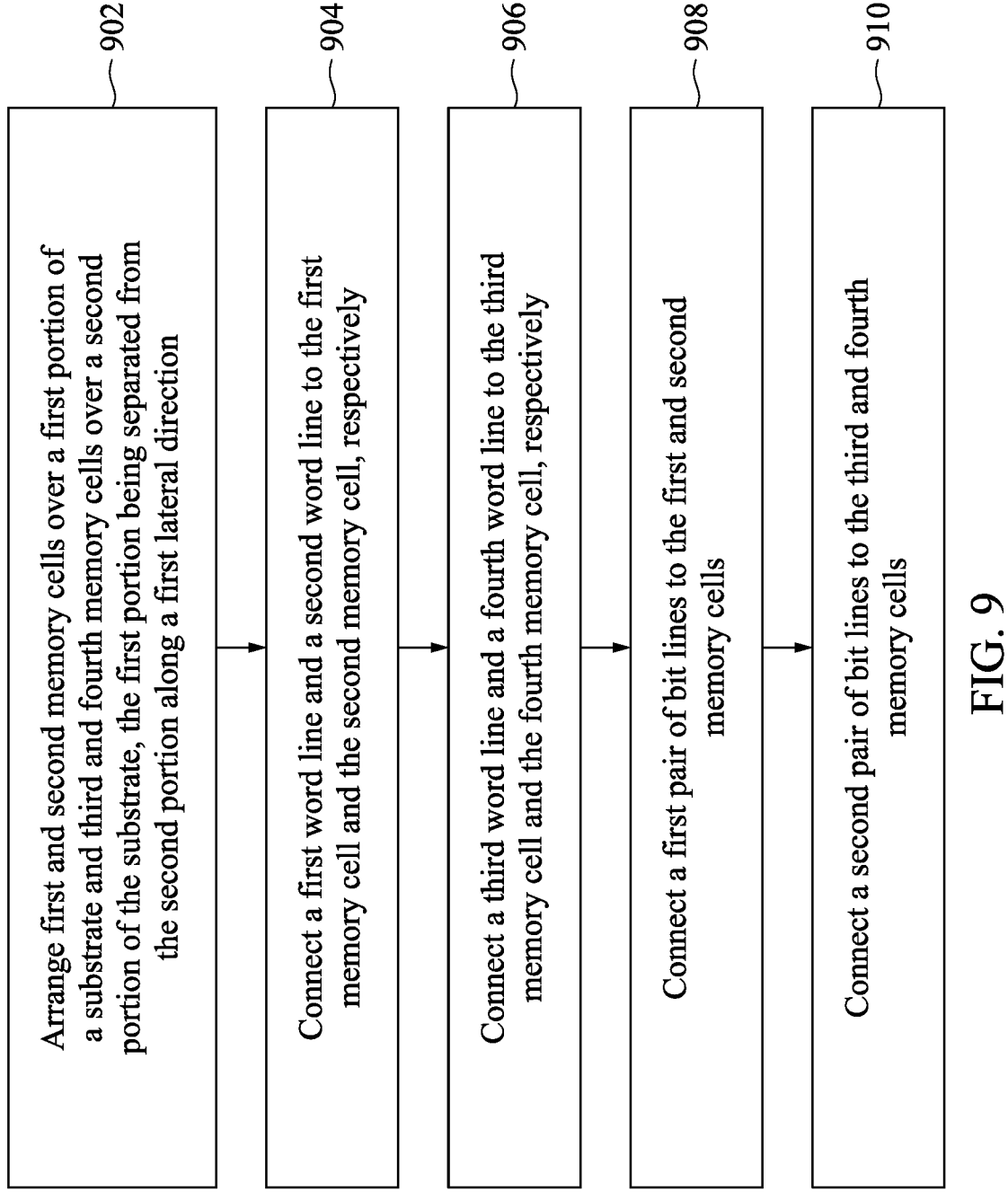

900

902 — Arrange first and second memory cells over a first portion of a substrate and third and fourth memory cells over a second portion of the substrate, the first portion being separated from the second portion along a first lateral direction 904 — Connect a first word line and a second word line to the first memory cell and the second memory cell, respectively 906 — Connect a third word line and a fourth word line to the third memory cell and the fourth memory cell, respectively 908 — Connect a first pair of bit lines to the first and second memory cells 910 — Connect a second pair of bit lines to the third and fourth memory cells

FIG. 9

FLY SHARED BIT LINE ON 4-CPP STATIC RANDOM ACCESS MEMORY (SRAM) CELL AND ARRAY

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is an example method of making memory arrays in accordance with some embodiments.

DETAILED DESCRIPTION

Figure 1:
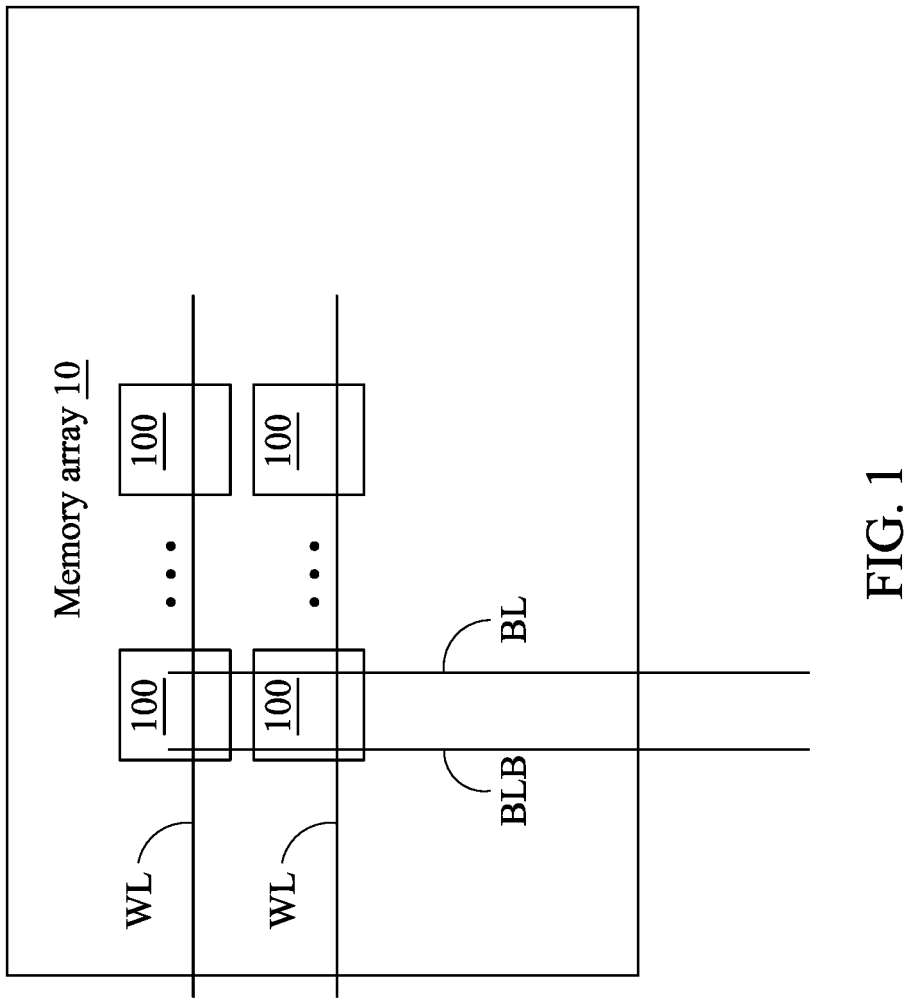
FIG. 1 is a block diagram illustrating an example of a memory array in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A common type of integrated circuit memory is a static random access memory (SRAM) device. A typical SRAM memory device has an array of memory cells, or "bit-cells." In some examples, each memory cell uses six transistors connected between an upper reference potential and a lower reference potential (typically ground) such that one of two storage nodes can be occupied by the information to be stored, with the complementary information stored at the other storage node. Each bit in the SRAM cell is stored on four of the transistors, which form two cross-coupled inverters. The other two transistors are connected to the memory cell word line to control access to the memory cell during read and write operations by selectively connecting the bit cell to its bit lines.

Typically, an SRAM device has an array of memory cells that include transistors formed using a fin field effect transistor (FinFET) architecture. For example, a polysilicon/metal structure can be connected to a semiconductor fin that extends above an isolation material. The polysilicon/metal structure functions as a gate of the FinFET transistor such that a voltage applied to the gate determines the flow of electrons between source/drain (S/D) contacts connected to the fin on opposite sides of the gate. A threshold voltage of the FinFET transistor is the minimum voltage for the transistor considered to be turned "on" such that an appreciable current can flow between the S/D contacts. The number of gates in contact with a fin along its length that are used in forming a SRAM cell can be considered to be the "pitch," often termed the "contacted polysilicon pitch" or CPP, of the SRAM cell along one dimension and is at least partially determinative of the density of the SRAM device.

For example, a two contacted poly pitch (2CPP) SRAM cell includes two pass gate transistors, two PMOS transistors, and two NMOS transistors that are collectively formed using a number of active regions (e.g., fins), the active regions having two gates (e.g., polysilicon or metal structures) connected thereto along its lengthwise direction and having a S/D contact connected to the active region between at least some of the gates. In the manufacture of typical 2CPP SRAM architectures, a process step requiring a cut of a portion of the fins in each cell is necessary to form a 6T SRAM cell. In addition, the memory cells arranged along neighboring rows typically share the same source/drain contact structure, which disadvantageously limits the capability for independently controlling (e.g., accessing) one or more certain rows and can have coupling issues. For example, in the 2CPP SRAM architectures, the neighboring cells typically rely on the shared source/drain contact structure to receive a supply voltage (e.g., cell VDD or CVDD). In certain scenarios, if the supply voltage is desired to be altered for some of the rows, it is significantly challenging using the 2CPP SRAM architectures. For some 4CPP SRAM architectures, the layout on an interconnection layer (e.g., M2) bit lines may encounter a coupling issue to degrade a read speed. Thus, the existing SRAM devices have not been entirely satisfactory in many aspects.

The present disclosure provides various embodiments of a memory device (e.g., an SRAM array) configured in a 4CPP architecture and designed to resolve the above-identified technical issues without compromising the design constraints. In some embodiments, the memory device, as disclosed herein, includes a number (e.g., 4) of double interleaved word lines and a plurality of fly shared bit lines disposed across a corresponding number (e.g., 4) of memory cells constructed in the 4CPP architecture. The term "double interleaved word lines" may be referred to at least four word lines has connections to four components (e.g., memory cells) at respectively different locations that are offset from one another along a first lateral direction (a direction in parallel with a lengthwise direction of the word lines) and a second lateral direction (a direction orthogonal to the lengthwise direction of the word lines). For example, four different rows (of a first column) of the memory cells may be laterally abutted to each other along a lengthwise direction of the word lines, and the four different rows (of a second column) of the memory cells may be laterally abutted to each other along the same lengthwise direction. The term "fly shared bit lines" may be referred to at least two pairs of bit lines have segmented connections to corresponding components (e.g., memory cells) at respectively different locations (e.g., a top bank and a bottom bank). As such, a length of corresponding bit lines and complementary bit lines of the disclosed memory device can be significantly reduced to about 4CPP (e.g., 2 times shorter than existing SRAM array). Thus, loading of the bit lines and complementary bit lines of the disclosed memory device can be advantageously reduced. Such reduced loading on the bit lines and complementary bit lines allows the disclosed memory device to scale up (e.g., in dimensions) without compromising its performance. By utilizing separated bank fly shared bit lines in a 4-CPP cell with interleaved word lines at the same time, the present disclosure provides a memory device design to avoid bit line coupling and to reduce bit line loading.

FIG. 1 is a block diagram illustrating an example of a memory array 10 in accordance with some embodiments. FIG. 1 shows a memory array 10 with a plurality of memory cells 100, or bit-cells 100. One or more peripheral circuits (not shown) may be located at one or more regions peripheral to, or within, the memory array 10. The memory cell 100 and the periphery circuits may be coupled by word lines and/or complementary bit lines BL and BLB, and data can read from and written to the memory cells 100 via the complementary bit lines BL and BLB. Different voltage combinations applied to the word lines and bit lines may define a read, erase or write (program) operation on the memory cells.

Figure 2:
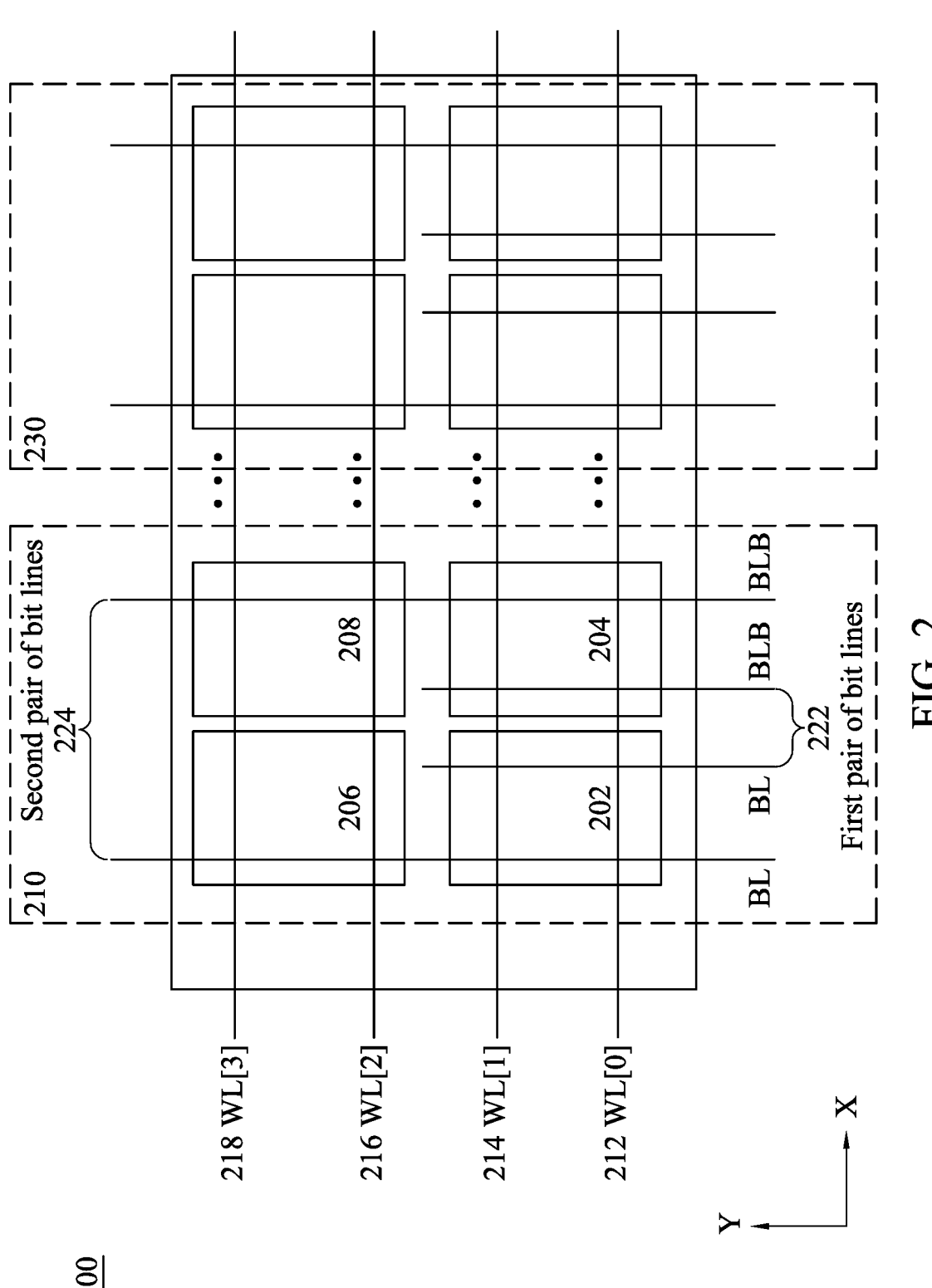
FIG. 2 is a block diagram illustrating an example of a semiconductor device in accordance with some embodiments.

FIG. 2 illustrates an example layout schematic of a semiconductor device 200 (e.g., a memory array (e.g., 10 in FIG. 1) configured in a 4CPP architecture), in accordance with some embodiments of the present disclosure. The semiconductor device 200 may include a first memory cell 202, a second memory cell 204, a third memory cell 206, a fourth memory cell 208, a plurality of word lines (e.g., WL [0] 212, WL [1] 214, WL [2] 216, and WL [3] 218), a first pair of bit lines 222, and a second pair of bit lines 224. The first to fourth memory cells are each formed based on a four contacted polysilicon pitch (4CPP) transistor architecture.

The first memory cell 202, the second memory cell 204, the third memory cell 206, and the fourth memory cell 208 can be operatively arranged along a first one of a plurality of columns. The first memory cell 202, the second memory cell 204, the third memory cell 206, and the fourth memory cell 208 can be operatively arranged in a first one, a second one, a third one, and a fourth one of a plurality of rows, respectively. The first column operatively corresponds to the first pair of bit lines 222 and the second pair of bit lines 224. The first to fourth rows operatively correspond to the first word line WL[0] 212, the second word line WL[1] 214, the third word line WL[2] 216, and the fourth word line WL[3] 218, respectively.

The semiconductor device 200 includes a plurality of blocks, 210, and 230, abutted to one another along a lateral direction (e.g., the X direction), and each block can correspond to the memory cells across different rows and along common columns (e.g., along pairs of bit lines), in accordance with various embodiments. For example in FIG. 2, the block 210 corresponds to the memory cells disposed across the first to fourth rows (e.g., WL [0], WL [1], WL [2], and WL [3]) and along the first pair of bit lines 222 and the second pair of bit lines 224. A memory cell can be at an intersection of a corresponding pair of the columns and rows. Along each of the columns, a pair of first bit line (BL) and first complementary bit line (BLB) and a pair of second bit line (BL) and second complementary bit line (BLB) are disposed; and along each of the rows, a word line (WL) is disposed.

The first memory cell 202 is physically arranged next to the second memory cell 204 along a second lateral direction (e.g., X). The third memory cell 206 is physically arranged next to the fourth memory cell 208 along the second lateral direction (e.g., X), the second lateral direction (e.g., X) being perpendicular to the first lateral direction (e.g., Y). In some embodiments, the first memory cell 202 is aligned with but physically spaced from the third memory cell 206 along the first lateral direction (e.g., Y), and the second memory cell 204 is aligned with but physically spaced from the fourth memory cell 208 along the first lateral direction (e.g., Y).

The first pair of bit lines 222 are operatively coupled to the first memory cell 202 and the second memory cell 204. The second pair of bit lines 224 are operatively coupled to the third memory cell 206 and the fourth memory cell 208. The first pair of bit lines 222 and the second pair of bit lines 224 are formed in a same one of a plurality of metallization layers disposed over the substrate. Although the word lines (e.g., WL [0] to WL [3]) and bit lines are shown as extending along the X direction and the Y direction, respectively, in the semiconductor device 200 of FIG. 2, it should be understood that corresponding physical interconnect structures functioning as such access lines can extend along the other direction while remaining within the scope of the present disclosure. Further, while the pairs of bit lines can be formed as interconnect structures, respectively, in a bottommost metallization layer (sometimes referred to as "M0 tracks") that extend along the Y direction and the word lines WL [0] to WL [3] can be formed as interconnect structures, respectively, in a next upper metallization layer (sometimes referred to as "M1 tracks") that extend along the X direction, the word lines WL [0] to WL [3] can be formed in one or more even upper metallization layers. For example, the word lines WL [0] to WL [3] may be formed as interconnect structures, respectively, in an even upper metallization layer (e.g., as M3 tracks or M5 tracks) that extend along the X direction. In yet another example, a first subgroup of the word lines, e.g., WL [0] and WL [2], may be formed as M3 tracks, respectively, and a second subgroup of the word lines, e.g., WL [1] and WL [3], may be formed as M5 tracks, respectively.

In some embodiments, the bit lines can traverse two banks or subarrays of memory cells, such as a top bank and a bottom bank. The first pair of bit lines 222, along a first lateral direction (e.g., Y), physically extend across a first portion (e.g., a bottom bank) of a substrate where the first 202 and second memory 204 cells are formed and terminates at a second portion (e.g., a top bank) of the substrate where the third 206 and fourth 208 memory cells are formed, while the second pair of bit lines 224, also along the first lateral direction (e.g., Y), physically extend across both of the first portion (e.g., the bottom bank) and the second portion (e.g., the top bank). In certain embodiments, the first and second memory cells 202, 204 belong to a first memory bank (e.g., a bottom bank), and the third and fourth memory cells belong to a second memory bank (e.g., a top bank).

With the disclosed arrangement, each of the bit lines and complementary bit lines may have a length that is about 4CPP, in accordance with various embodiments of the present disclosure. Such a significantly shorten length (e.g., in comparison with the 8CPP length of existing memory devices) allows the disclosed memory device to more flexibly scale up in dimensions, without sacrificing the loading on the bit lines (and complementary bit lines). For example, to form a 8×8 memory array, the length of bit lines and complementary bit lines of such a memory array may only be increased to about 8CPP, instead of 16CPP in the existing memory devices. Shorter bit lines typically have less resistance, which can advantageously decrease voltage drop along the bit lines and can in turn increase operation speed of the memory device.

Figure 3:
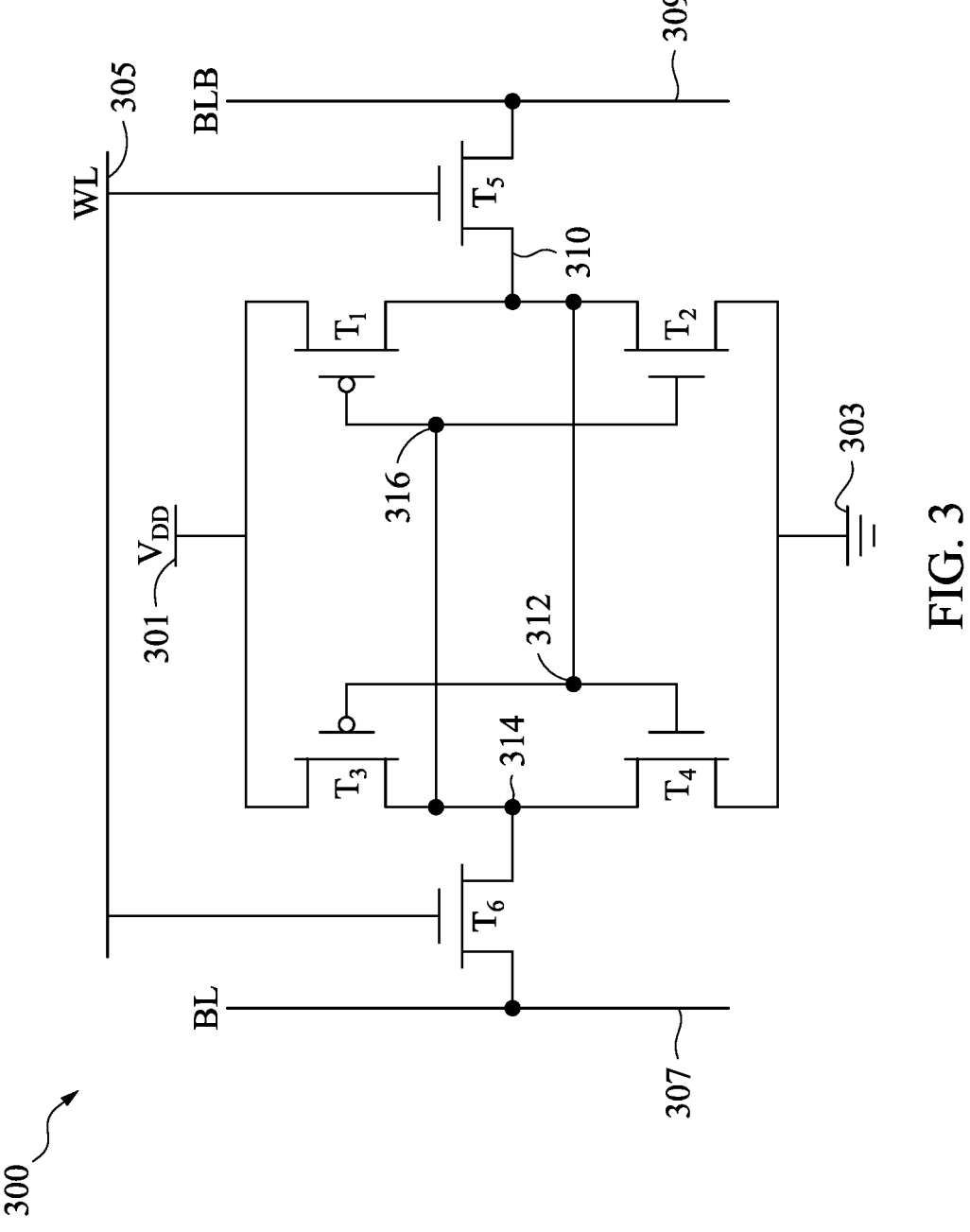
FIG. 3 is a circuit diagram illustrating an example 6T memory cell in accordance with some embodiments.

FIG. 3 is a circuit diagram illustrating an example 6T memory cell in accordance with some embodiments. Referring to FIG. 3, an example circuit diagram of a memory cell (a memory bit, or a bit cell) 300 is illustrated. In accordance with some embodiments of the present disclosure, the memory cell 300 in configured as a static random access memory (SRAM) cell that includes a number of transistors. For example in FIG. 3, the memory cell 300 includes a six-transistor (6T)-SRAM cell. Each of the transistors may be formed in a nanostructure transistor configuration, which shall be discussed in further detail below. In some other embodiments, the memory cell 300 may be implemented as any of a variety of other SRAM cells such as, for example, a two-transistor-two-resistor (2T-2R) SRAM cell, a four-transistor (4T)-SRAM cell, an eight-transistor (8T)-SRAM cell, a ten-transistor (10T)-SRAM cell, etc. Further, although the discussion of the current disclosure is directed to an SRAM cell, it is understood that other embodiments of the current disclosure can also be used in any of the memory cells such as, for example, dynamic random access (DRAM) memory cells.

As shown in FIG. 3, the memory cell 300 includes 6 transistors: T1, T2, T3, T4, T5, and T6. The transistors T1 and T2 are formed as a first inverter and the transistors T3 and T4 are formed as a second inverter, wherein the first and second inverters are cross-coupled to each other. Specifically, the first and second inverters are each coupled between first voltage reference 301 and second voltage reference 303. In some embodiments, the first voltage reference 301 is a voltage level of a supply voltage applied to the memory cell 300, which is typically referred to as "Vdd." The second voltage reference 303 is typically referred to as "ground." The first inverter (formed by the transistors T1 and T2) is coupled to the transistor T5, and the second inverter (formed by the transistors T3 and T4) is coupled to the transistor T6. In addition to being coupled to the first and second inverters, the transistors T6 and T5 are each coupled to a word line (WL) 305 and are coupled to a bit line (BL) 307 and a complementary bit line 309 (sometimes referred to as bit line bar or BLB), respectively.

In some embodiments, the transistors T1 and T3 are referred to as pull-up transistors of the memory cell 300 (hereinafter "pull-up transistor T1" and "pull-up transistor T3," respectively); the transistors T2 and T4 are referred to as pull-down transistors of the memory cell 300 (hereinafter "pull-down transistor T2" and "pull-down transistor T4," respectively); and the transistors T5 and T6 are referred to as access transistors of the memory cell 300 (hereinafter "access transistor T5" and "access transistor T6," respectively). In some embodiments, the transistors T2, T4, T5, and T6 each includes an n-type metal-oxide-semiconductor (NMOS) transistor, and T1 and T3 each includes a p-type metal-oxide-semiconductor (PMOS) transistor. Although the illustrated embodiment of FIG. 3 shows that the transistors T1-T6 are either NMOS or PMOS transistors, any of a variety of transistors or devices that are suitable for use in a memory device may be implemented as at least one of the transistors T1-T6 such as, for example, a bipolar junction transistor (BJT), a high-electron-mobility transistor (HEMT), etc.

The access transistors T5 and T6 each has a gate coupled to the WL 305. The gates of the transistors T5 and T6 are configured to receive a pulse signal, through the WL 305, to allow or block an access of the memory cell 300 accordingly, which will be discussed in further detail below. The transistors T2 and T5 are coupled to each other at node 310 with the transistor T2's drain and the transistor T5's source. The node 310 is further coupled to a drain of the transistor T1 and node 312. The transistors T4 and T6 are coupled to each other at node 314 with the transistor T4's drain and the transistor T6's source. The node 314 is further coupled to a drain of the transistor T3 and node 316.

When a memory cell (e.g., the memory cell 300) stores a data bit, a first node of the bit cell is configured to be at a first logical state (either a logical 1 or a logical 0), and a second node of the bit cell is configured to be at a second logical state (either a logical 0 or a logical 1). The first and second logical states are complementary with each other. In some embodiments, the first logical state at the first node may represent the logical state of the data bit stored in the memory cell. For example, in the illustrated embodiment of FIG. 3, when the memory cell 300 store a data bit at a logical 1 state, the node 310 is configured to be at the logical 1 state, and the node 314 is configured to be at the logical 0 state.

To read the logical state of the data bit stored in the memory cell 300, the BL 307 and BLB 309 are pre-charged to Vdd (e.g., a logical high, e.g., using a capacitor to hold the charge). Then the WL 305 is asserted, or activated, by an assert signal to a logical high, which turns on the access transistors T5 and T6. Specifically, a rising edge of the assert signal is received at the gates of the access transistors T5 and T6, respectively, so as to turn on the access transistors T5 and T6. Once the access transistors T5 and T6 are turned on, based on the logical state of the data bit, the pre-charged BL 307 or BLB 309 may start to be discharged. For example, when the memory cell 300 stores a logical 0, the node 314 (e.g., Q) may present a voltage corresponding to the logical 1, and the node 310 (e.g., Q bar) may present a voltage corresponding to the complementary logical 0. In response to the access transistors T5 and T6 being turned on, a discharge path, starting from the pre-charged BLB 309, through the access transistor T5 and pull-down transistor T2, and to ground 303, may be provided. While the voltage level on the BLB 309 is pulled down by such a discharge path, the pull-down transistor T4 may remain turned off. As such, the BL 307 and the BLB 309 may respectively present a voltage level to produce a large enough voltage difference between the BL 307 and BLB 309. Accordingly, a sensing amplifier, coupled to the BL 307 and BLB 309, can use a polarity of the voltage difference to determine whether the logical state of the data bit is a logical 1 or a logical 0.

To write the logical state of the data bit stored in the memory cell 300, the data to be written is applied to the BL 307 and/or the BLB 309. For example, BLB 309 is tied/ shorted to OV, e.g., ground 303, with a low-impedance connection. Then, the WL 305 is asserted, or activated, by an assert signal to a logical high, which turns on the access transistors T5 and T6. Once the access transistors T5 and T6 are turned on, based on the logical state of BLB 309, the node 310 may start to be discharged. For example, before T5 and T6 are turned on, the BLB 309 may present a voltage corresponding to the logical 0, and the node 310 may present a voltage corresponding to the complementary logical 1. In response to the access transistors T5 and T6 being turned on, a discharge path, starting from the node 310, through the access transistor T5 to ground 303, may be provided. Once the voltage level on the node 310 is pulled down below the Vth (threshold voltage) of the pull-down transistor T4, T4 may turn off and T3 may turn on, causing node 314 to be pulled up to Vdd 301. Once node 314 is less than a Vth from Vdd 301, T1 may turn off and T2 may turn off, causing node 310 to be pulled down to ground 303. Then, when the WL 305 is de-asserted, the logical state applied to the BL 307 and/or the BLB 309 has been stored in the memory cell 300.

Figure 4:
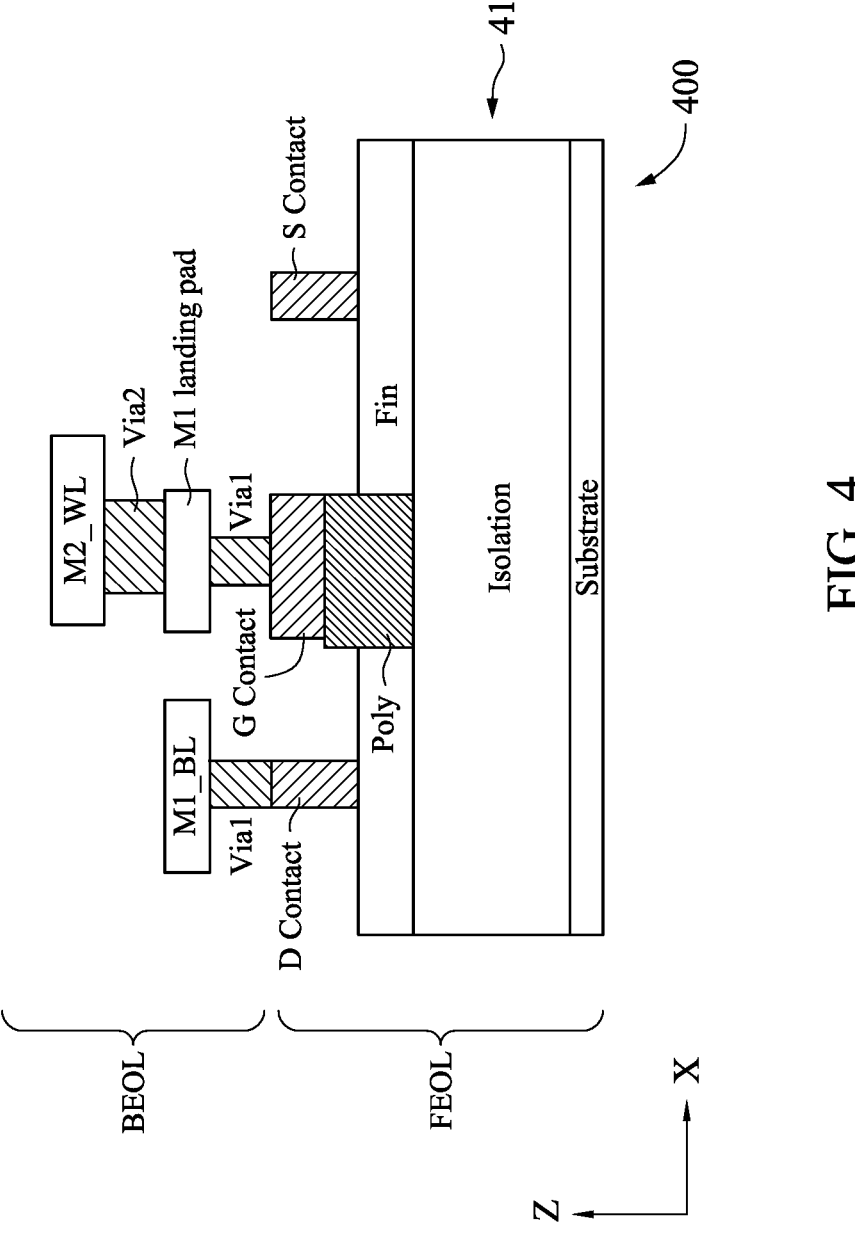
FIG. 4 is a block diagram illustrating a cross-section of an example semiconductor structure in accordance with some embodiments.

To further illustrate relative (e.g., vertical) arrangement of these structures in FIG. 2, FIG. 4 depicts a cross-section of an example semiconductor structure 400 (e.g., semiconductor device 200 in FIG. 2) in accordance with some embodiments. The embodiment shown includes a FEOL layer including semiconductor structures and a BEOL layer including interconnect metal layer structures.

In the embodiment shown, the FEOL layer illustrates a pass gate FinFET transistor 410. The FinFET transistor 410 includes a semiconductor substrate, a fin, an isolation region, a polysilicon structure, e.g. poly, the conductive contacts S and D connected to the fin, and the conductive G contact connected to the polysilicon structure. In the embodiment shown, the conduction path for current is the fin (the fin can also be referred to as the diffusion region or oxide diffusion region). The polysilicon structure functions as a gate allowing current flow in the fin from the S (e.g. source) contact to the D (e.g. drain) contact. For example, for a voltage potential between the S and D contacts, current can flow in the fin from S to D depending on a voltage applied to the polysilicon structure. If a voltage less than a threshold voltage is applied to the poly, then appreciable current cannot flow in the fin from the S to the D contacts, and the transistor 410 is "off." If a voltage greater than or equal to the threshold voltage is applied to the poly, appreciable current flows from S to D via the fin and the transistor 410 is "on." In some embodiments, the S, D, and G contacts form connections between multiple fins and polysilicon structures in the FEOL layer, thereby connecting the sources, drains, and gates of one or more transistors. In some embodiments, the sources, drains, and gates of the transistor 410 are connected to an interconnect metal layer structure in the BEOL layer. For example, typically the gates of the transistor 410 is connected to a word line, the word line being one of the metal bars in one of the layers of the interconnect metal structure in the BEOL layer, and the S/D contacts of pass gate transistors 410 can similarly be connected to the complementary bit lines BL and BLB, the complementary bit lines BL and BLB being other ones of the metal bars in one or more of the metal layers in the BEOL layer. In some embodiments, the BEOL layer serves to connect the transistor 410 to peripheral circuits, for example for read/write operations. In the embodiment shown, the D, and G contacts connect to the metal bars in the BEOL layer using vias. For example, Via1 forms a connection between the D contact to a metal bar, e.g. a bit line, in the first metal layer M1 above the FEOL layer. In the embodiment shown, a separate Via1 connects the G contact to a conductive landing pad in the M1 layer, and Via2 connects the conductive landing pad to a metal bar, e.g. the word line, in the M2 layer. In some embodiments, the conductive landing pad in the M1 layer can be formed from a metal bar that has been cut, or disconnected, in the plane of its metal layer.

Figure 5:
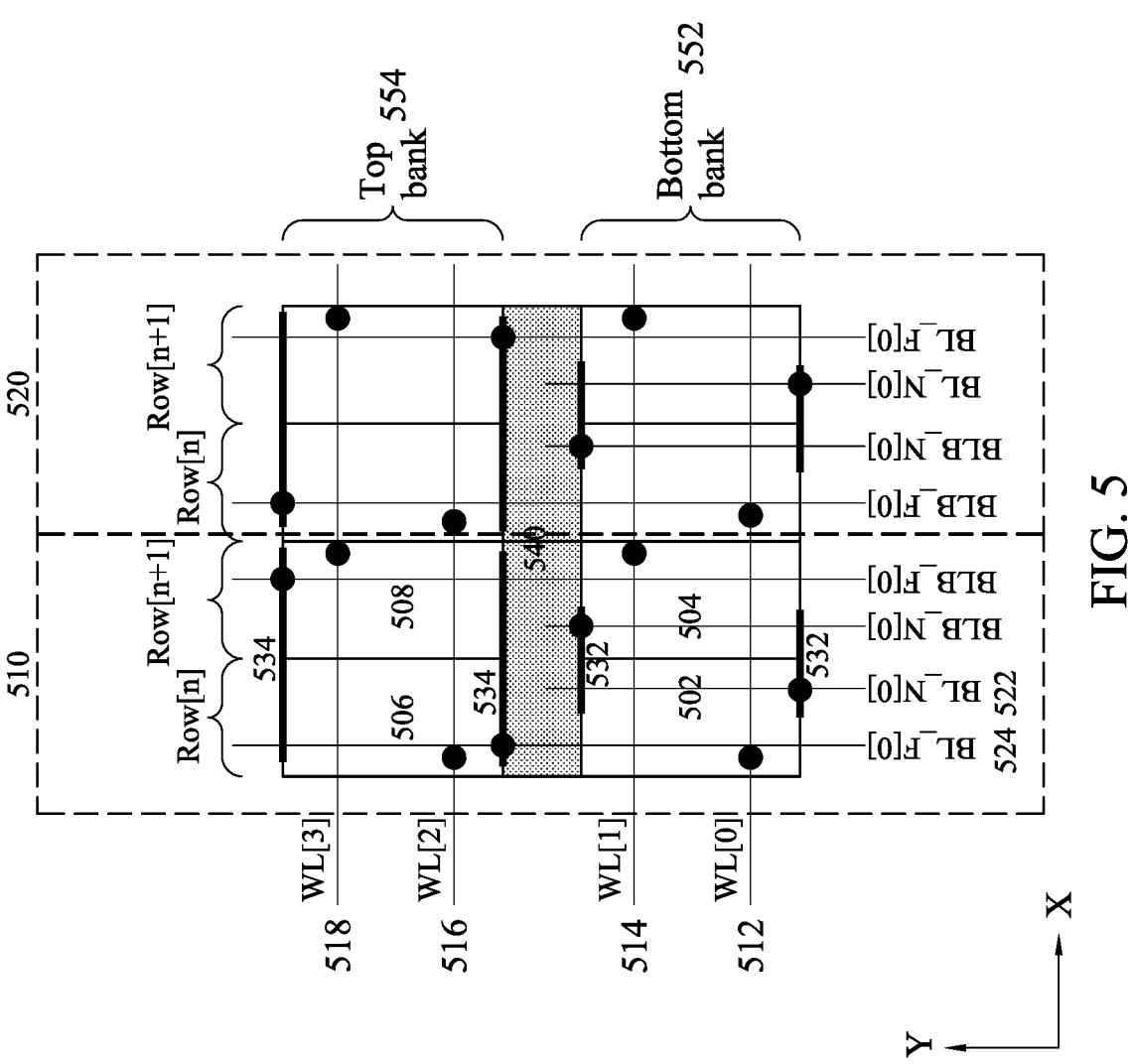
FIG. 5 is an example layout schematic of a memory array configured in a 4CPP architecture, in accordance with some embodiments of the present disclosure.
Figure 6:
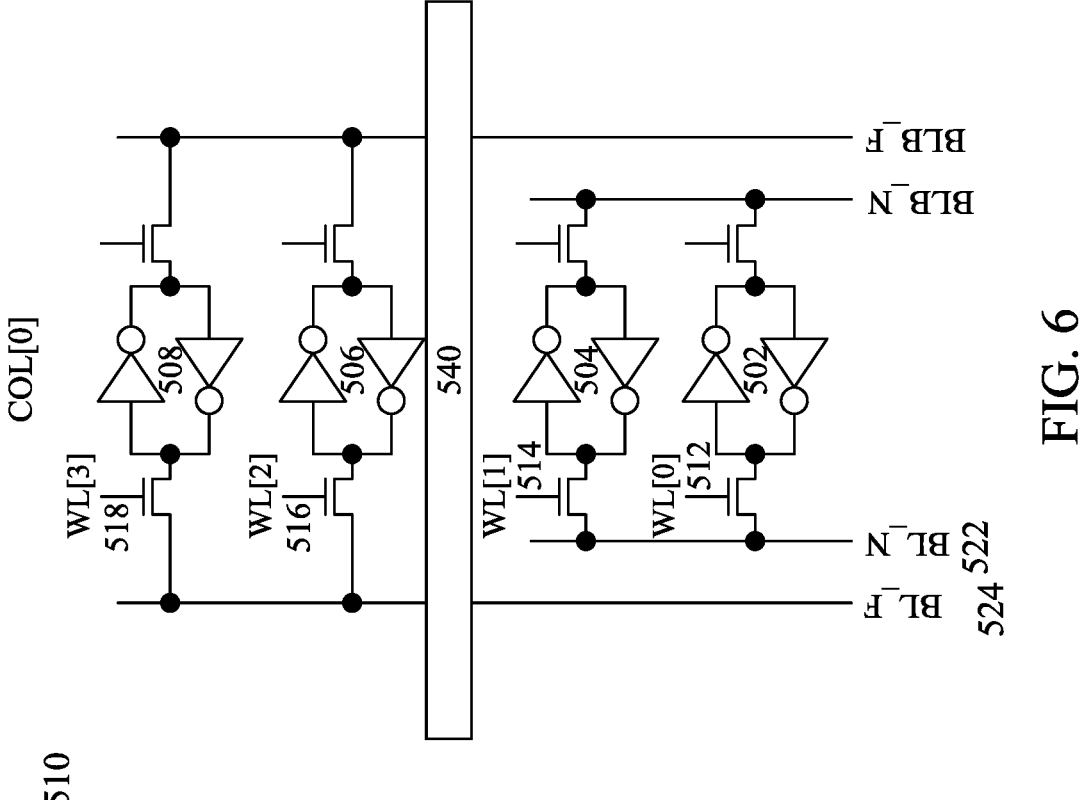
FIG. 6 illustrates a schematic view of a memory array configured in a 4CPP architecture corresponding to the memory array of FIG. 5, in accordance with some embodiments of the present disclosure.

FIG. 5 is an example layout schematic of a memory array 500 (e.g., semiconductor device 200 in FIG. 2) configured in a 4CPP architecture, in accordance with some embodiments of the present disclosure. FIG. 6 illustrates a schematic view of a memory array configured in a 4CPP architecture corresponding to the first block 510 of FIG. 5, in accordance with some embodiments of the present disclosure. The memory array 500 may include a first block 510, a second block 520, a first sub-block 502 (e.g., a first memory cell), a second sub-block 504 (e.g., a second memory cell), a third sub-block 506 (e.g., a third memory cell), a fourth sub-block 508 (e.g., a fourth memory cell), a plurality of word lines (e.g., WL [0] 512, WL [1] 514, WL [2] 516, and WL [3] 518), a first pair of bit lines 522, a second pair of bit lines 524, a pair of first source/drain interconnect structures 532, a pair of second source/drain interconnect structures 534, and a bit line jumper 540 (or a bit line cut). The memory array 500 of FIG. 5 is substantially similar to the semiconductor device 200 of FIG. 2, except for the bit line jumper 540 and a certain row sequence to further avoid a bit line coupling. Thus, the following description of the memory array 500 will be focused on the difference.

Each block 510 or 520 includes four sub-blocks, and each sub-block can correspond to a memory cell, in accordance with various embodiments. Using the block 510 as a representative example, the block 510 has four sub-blocks, 502, 504, 506, and 508. The sub-block 502 corresponds to the memory cell at the intersection of WL[0] 512 (ROW[0]) and a near end bit line of the first pair of bit lines 522 (herein referred to as "BL_N[0]"); the sub-block 504 corresponds to the memory cell at the intersection of WL[1] 514 (ROW[1]) and a near end complementary bit line of the first pair of bit lines 522 (herein referred to as "BLB_N[0]"); the sub-block 506 corresponds to the memory cell at the intersection of WL[2] 516 (ROW[2]) and a far end bit line of the second pair of bit lines 522 (herein referred to as "BL_F[0]"); and the sub-block 508 corresponds to the memory cell at the intersection of WL[3] 518 (ROW[3]) and a far end complementary bit line of the second pair of bit lines 522 (herein referred to as "BLB_F[0]").

In various embodiments, each of the blocks 510 to 520 in FIG. 5 is configured in a 4CPP architecture. Alternatively stated, each block has four polysilicon/metal (gate) structures traversing thereacross. In certain embodiments, each sub-block can also have four polysilicon/metal (gate) structures traversing thereacross. These four gates can correspond to WL[0] 512, WL[1] 514, WL[2] 516, and WL[3] 518, respectively.

The plurality of word lines can be double interleaved word lines. The term "double interleaved word lines" may be referred to at least four word lines has connections to four components (e.g., memory cells) at respectively different locations that are offset from one another along a first lateral direction (a direction in parallel with a lengthwise direction of the word lines) and a second lateral direction (a direction orthogonal to the lengthwise direction of the word lines). Accordingly, the memory cells of different rows (corresponding to different word lines) and in the same column (corresponding to the same bit line) may be spaced from or otherwise arranged with one another based on such interleaved word lines WL[0] to WL[3], and the memory cells of different columns (corresponding to different bit lines) can be laterally abutted to one another using the interleaved word lines WL[0] to WL[3], as shown in FIG. 5. For example, the first memory cell 502 and the third memory cell 506 may operatively (e.g., electrically) couple to WL[0] 512 and WL[2] 516, respectively (herein referred to as "Row[n]"); and the second memory cell 504 and the fourth memory cell 508 may operatively (e.g., electrically) couple to WL[1] 514 and WL[3] 518 (herein referred to as "Row [n+1]"). In some embodiments, the block 520 can have the same double interleaved word lines arrangement as the block 510. The row sequence of the memory array 500 can be Row[n], Row[n+1], Row[n], Row[n+1], which can effectively avoid bit line coupling.

Further, at least two sub-blocks of each block, abutted to one another along a lateral direction (e.g., the X direction), can share a common pair of bit lines and complementary bit lines. There can be a near end pair of bit lines 522 and a far end pair of bit lines 524 in the memory array 500. In some embodiments, the memory cells of different rows (corresponding to different word lines) and in the same column can shared a common pair of bit lines and complementary bit lines. For example, the two sub-blocks 502 and 504 of the block 510 (the memory cells along the first pair of bit lines 522 and across WL[0] to WL[1]) share bit line BL_N[0] and complementary bit line BLB_N[0] through the pair of first source/drain interconnect structures ($1^{st}$ MDs) 532; the two sub-blocks 506 and 508 of the block 510 (the memory cells along the second pair of bit lines 524 and across WL[2] to WL[3]) share bit line BL_F[0] and complementary bit line BLB_F[0] through the pair of second source/drain interconnect structures ($2^{nd}$ MDs) 534.

In some embodiments, the first pair of bit lines 522 and the second pair of bit lines 524 can be formed in the same metal layer (e.g., M0, M2, or M4). In various embodiments, a fly shared bit lines structure can be configured in the memory array 500. The term "fly shared bit lines" may be referred to at least two pairs of bit lines have segmented connections to corresponding components (e.g., memory cells) at respectively different locations (e.g., a top bank and a bottom bank). For example, the first pair of bit lines 522, along a first lateral direction (e.g., Y), physically extend across a first portion of a substrate where the first memory cell 502 and the second memory cell 504 are formed and terminates at the bit line jumper 540 (e.g., a middle transition region). The second pair of bit lines 524, also along the first lateral direction (e.g., Y), physically extend across the first portion, the bit line jumper 540, and a second portion of the substrate where the third memory cell 506 and the fourth memory cell 508 are formed. In some embodiments, the bit line jumper 540 can be a 2-CPP or 4-CPP transition for bit line cut. The first memory cell 502 can be aligned with but physically spaced from the third memory cell 506 along a first lateral direction (e.g., Y). The second memory cell 504 can be aligned with but physically spaced from the fourth memory cell 508 along the first lateral direction (e.g., Y).

The bit lines can traverse two banks or subarrays of memory cells, such as a top bank and a bottom bank. The first memory cell 502 and the second memory cell 504 may belong to a first memory bank (e.g., a bottom bank), and the third memory cell 506 and the fourth memory cell 508 may belong to a second memory bank (e.g., a top bank). The separated bank fly shared bit lines in 4-CPP cell with interleaved word lines design provides improvement on speed and power (e.g., resistance-capacitance (RC) optimization). For instance, the front end capacitance can keep 0.5× to a 2-CPP conventional cell. The back end capacitance and front end capacitance can be reduced due to shorter bit line length and larger bit line space. There is no coupling issue due to the shared bit line and the word line sequence, which avoid same row access situation. A read speed is more aggressive due to the smaller bit line capacitance and no bit line coupling concern. By utilizing separated bank fly shared bit lines in a 4-CPP cell with interleaved word lines at the same time, the present disclosure provides a memory device design to avoid bit line coupling and to reduce bit line loading.

Figure 7:
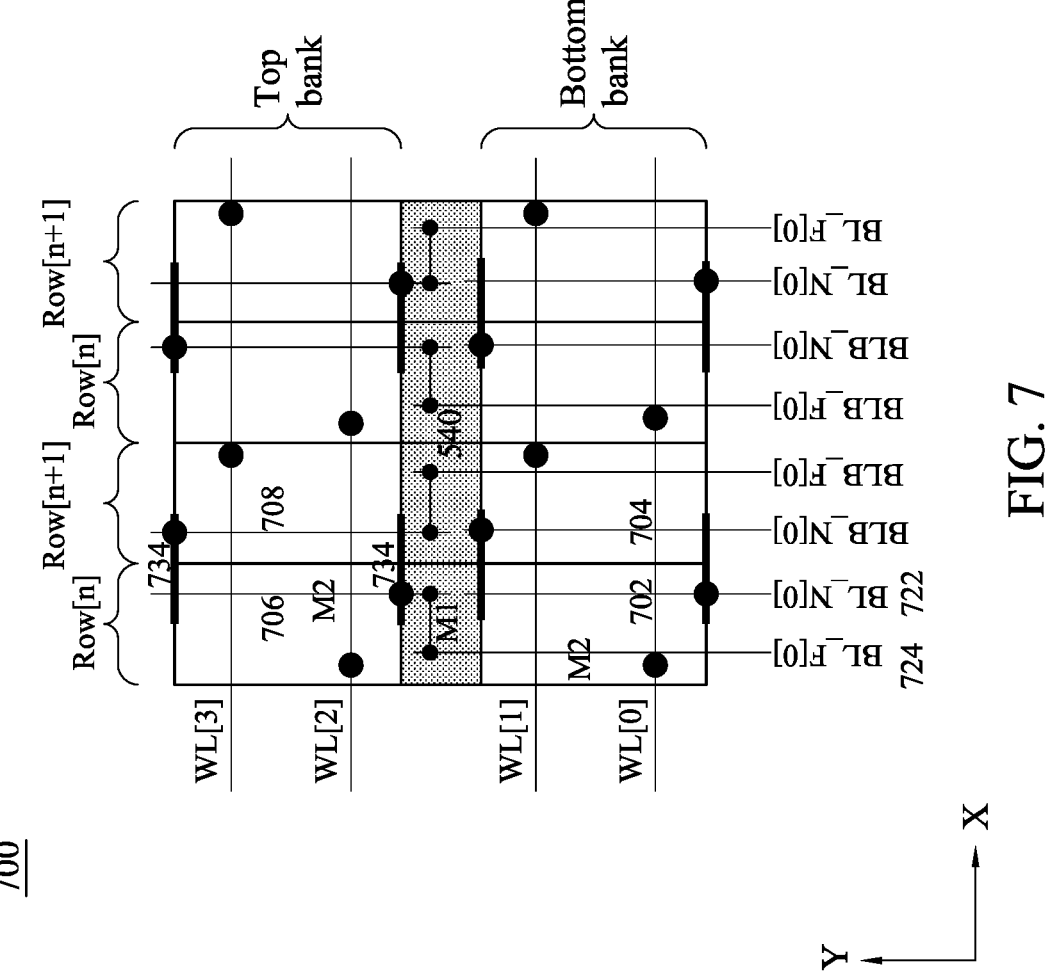
FIG. 7 is an example layout schematic of a memory array configured in a 4CPP architecture, in accordance with some embodiments of the present disclosure.

FIG. 7 is an example layout schematic of a memory array 700 configured in a 4CPP architecture, in accordance with some embodiments of the present disclosure. The memory array 700 of FIG. 7 is substantially similar to the memory array 500 of FIG. 5, except for the arrangement of far end bit lines 724 and source/drain interconnect structures to further reduce bit line capacitance. Thus, the following description of the memory array 700 will be focused on the difference.

In some embodiments, a pair of near end bit lines 722 can be formed in a first one of a plurality of metallization layers disposed over a substrate. A pair of far end bit lines 724 may include two portions formed in different metallization layers. For example, a first portion of the pair of far end bit lines 724 can be formed in a first metallization layer (e.g., M2 layer) of the plurality of metallization layers, and a second portion of the pair of far end bit lines 724 can be formed in a second metallization layer (e.g., M1 layer) of the plurality of metallization layers. The first portion of each of the pair of far end bit lines 724 may extend in a first lateral direction (e.g., Y). The second portion of each of the pair of far end bit lines 724 may extend in a second lateral direction (e.g., X). The formation order of the pair of far end bit lines 724 in the plurality of metallization layers can be: M2→M1→M2. A source/drain interconnect structures 734 can be shorter at a top bank to reduce bit line capacitance. A bit line jumper 540 can be a 2-CPP or 4-CPP transition to optimize bit line resistance-capacitance (R/C).

Figure 8:
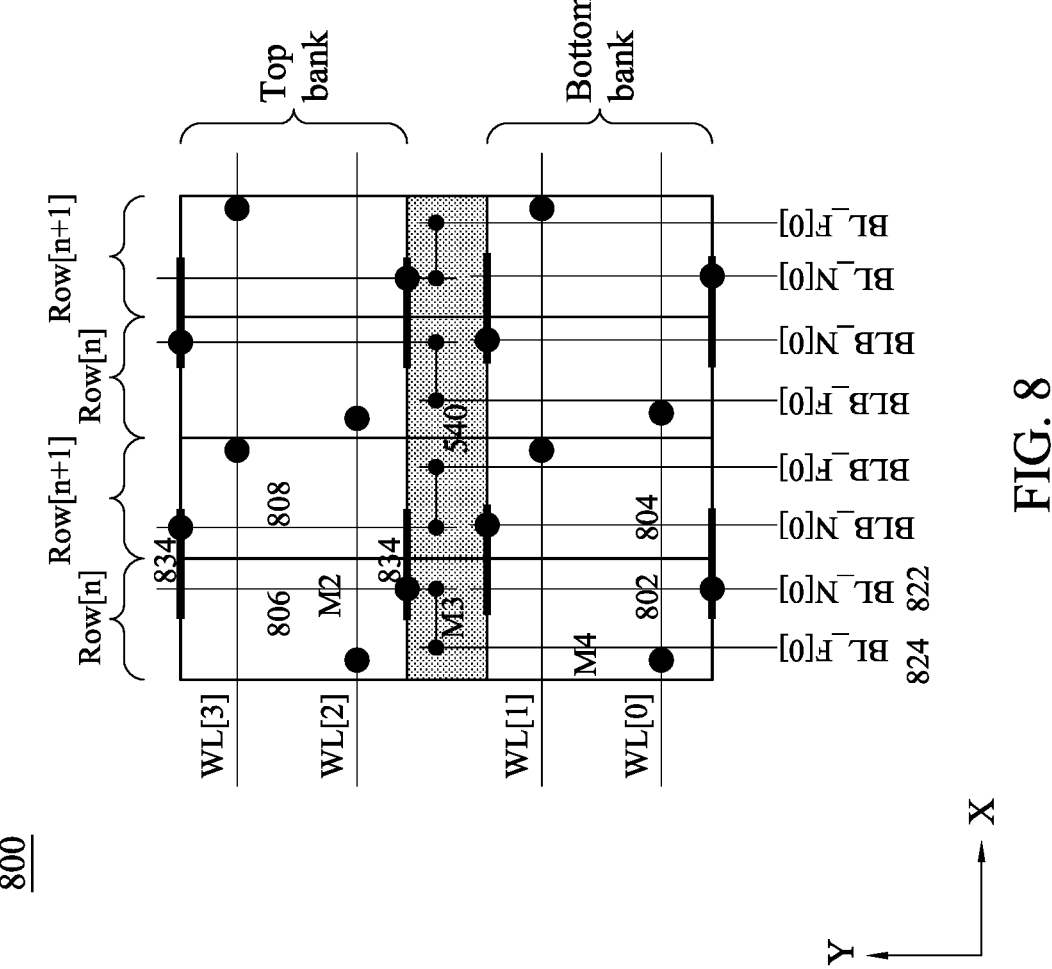
FIG. 8 is an example layout schematic of a memory array configured in a 4CPP architecture, in accordance with some embodiments of the present disclosure.

FIG. 8 is an example layout schematic of a memory array 800 configured in a 4CPP architecture, in accordance with some embodiments of the present disclosure. The memory array 800 of FIG. 8 is substantially similar to the memory array 500 of FIG. 5, except for the arrangement of far end bit lines 824 and source/drain interconnect structures to further reduce bit line capacitance. Thus, the following description of the memory array 800 will be focused on the difference.

In some embodiments, a pair of near end bit lines 822 can be formed in a first one of a plurality of metallization layers disposed over a substrate. A pair of far end bit lines 824 may include three portions formed in different metallization layers. For example, a first portion of the pair of far end bit lines 824 can be formed in a first metallization layer (e.g., M4 layer) of the plurality of metallization layers, a second portion of the pair of far end bit lines 824 can be formed in a second metallization layer (e.g., M3 layer) of the plurality of metallization layers, and a third portion of the pair of far end bit lines 824 can be formed in a third metallization layer (e.g., M2 layer) of the plurality of metallization layers. The formation order of the pair of far end bit lines 824 in the plurality of metallization layers can be: M4→M3→M2. A source/drain interconnect structures 834 can be shorter at a top bank to reduce bit line capacitance. The pair of near end bit lines 822 can be formed in the third metallization layer (e.g., M2 layer) of the plurality of metallization layers. The M2 layer can have larger space to reduce bit line capacitance. A bit line jumper 540 can be a 2-CPP or 4-CPP transition to optimize bit line resistance-capacitance (R/C). A first memory cell 802 can be aligned with but physically spaced from a third memory cell 806 along a first lateral direction (e.g., Y). A second memory cell 804 can be aligned with but physically spaced from a fourth memory cell 808 along the first lateral direction (e.g., Y).

FIG. 9 is an example method of making memory arrays in accordance with some embodiments. In overview, the method 900 may include making memory arrays to avoid bit line coupling and to reduce bit line loading.

The method 900 starts with operation 902 in which a first memory cell, a second memory cell, a third memory cell, and a fourth memory cell can be provided. For example, the memory cells can be formed on the substrate based on the semiconductor device 200 (FIG. 2), the memory array 500 (FIG. 5), the memory array 700 (FIG. 7), or the memory array 800 FIG. 8). The first memory cell (corresponding to, e.g., 202, 502, 702, or 802) and the second memory cell (corresponding to, e.g., 204, 504, 704, or 804) can be arranged over a first portion of a substrate. The third memory cell (corresponding to, e.g., 206, 506, 706, or 806) and the fourth memory cell (corresponding to, e.g., 208, 508, 708, or 808) can be arranged over a second portion of the substrate. The first portion can be separated from the second portion along a first lateral direction (e.g., Y direction). Each of the first to four memory cells may comprise a plurality of transistors formed based on a four contacted polysilicon pitch (4CPP) architecture. The first memory cell (corresponding to, e.g., 202, 502, 702, or 802) and the second memory cell (corresponding to, e.g., 204, 504, 704, or 804) can be physically arranged next to each other along a second lateral direction (e.g., X direction) perpendicular to the first lateral direction (e.g., Y direction). The third memory cell (corresponding to, e.g., 204, 504, 704, or 804) and the fourth memory cell (corresponding to, e.g., 208, 508, 708, or 808) can be physically arranged next to each other along the second lateral direction (e.g., X direction).

The method 900 continues to operation 904 in which a first word line and a second word line can be connected to the first memory cell and the second memory cell, respectively. In some embodiments, the first word line (corresponding to WL[0] in FIG. 2, 5, 7, or 8) can be connected to the first memory cell (corresponding to, e.g., 202, 502, 702, or 802), and the second word line (corresponding to WL[1] in FIG. 2, 5, 7, or 8) can be connected to the second memory cell (corresponding to, e.g., 204, 504, 704, or 804).

The method 900 continues to operation 906 in which a third word line and a fourth word line can be connected to the third memory cell and the fourth memory cell, respectively. In some embodiments, the third word line (corresponding to WL[2] in FIG. 2, 5, 7, or 8) can be connected to the third memory cell (corresponding to, e.g., 206, 506, 706, or 806), and the fourth word line (corresponding to WL[3] in FIG. 2, 5, 7, or 8) can be connected to the fourth memory cell (corresponding to, e.g., 208, 508, 708, or 808).

The method 900 continues to operation 908 in which a first pair of bit lines can be connected to the first and second memory cells. For example, the first pair of bit lines (corresponding to 222, 522, 722, or 822) can be connected to the first memory cell (corresponding to, e.g., 202, 502, 702, or 802) and the second memory cell (corresponding to, e.g., 204, 504, 704, or 804). In certain embodiments, the first pair of bit lines (corresponding to 222, 522, 722, or 822), along the first lateral direction (e.g., Y direction), may physically extend across the first portion and may terminate at the second portion.

The method 900 continues to operation 910 in which a second pair of bit lines can be connected to the third and fourth memory cells. For example, the second pair of bit lines (corresponding to 224, 524, 724, or 824) can be connected to the third memory cell (corresponding to, e.g., 206, 506, 706, or 806) and the fourth memory cell (corresponding to, e.g., 208, 508, 708, or 808). The second pair of bit lines (corresponding to 224, 524, 724, or 824), along the first lateral direction (e.g., Y direction), may physically extend across both of the first portion and the second portion. Comparing to conventional 2-CPP wide cell, the shared bit lines on 4-CPP SRAM tall cell with interleaved word lines design provides improvement on read speeds and coupling issues.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first memory cell, a second memory cell, a third memory cell, and a fourth memory cell operatively arranged along a first one of a plurality of columns, and operatively arranged in a first one, a second one, a third one, and a fourth one of a plurality of rows, respectively;
   wherein the first column operatively corresponds to a first pair of bit lines and a second pair of bit lines, and the first to fourth rows operatively correspond to a first word line, a second word line, a third word line, and a fourth word line, respectively;
   wherein the first pair of bit lines are operatively coupled to the first and second memory cells, and the second pair of bit lines are operatively coupled to the third and fourth memory cells;
   wherein the first pair of bit lines, along a first lateral direction, physically extend across a first portion of a substrate where the first and second memory cells are formed and terminates at a second portion of the substrate where the third and fourth memory cells are formed, while the second pair of bit lines, also along the first lateral direction, physically extend across both of the first portion and the second portion;

wherein the first pair of bit lines are formed in a first one of a plurality of metallization layers disposed over the substrate, while the second pair of bit lines each have a first portion formed in the first metallization layer and a second portion formed in a second one of the plurality of metallization layers, and wherein the first memory cell is physically arranged next to the second memory cell along a second lateral direction, and the third memory cell is physically arranged next to the fourth memory cell along the second lateral direction, the second lateral direction being perpendicular to the first lateral direction.

2. The semiconductor device of claim 1, wherein the first to fourth memory cells are each formed based on a four contacted polysilicon pitch (4CPP) transistor architecture.

3. The semiconductor device of claim 1, wherein the first memory cell is aligned with but physically spaced from the third memory cell along the first lateral direction, and the second memory cell is aligned with but physically spaced from the fourth memory cell along the first lateral direction.

4. The semiconductor device of claim 3, wherein the first and second memory cells belong to a first memory bank, and the third and fourth memory cells belong to a second memory bank.

5. The semiconductor device of claim 1, wherein at least one portion of each of the first pair of bit lines and the second pair of bit lines are formed in a same one of a plurality of metallization layers disposed over the substrate.

6. The semiconductor device of claim 1, wherein the first portion of each of the second pair of bit lines extends in the first lateral direction, and the second portion of each of the second pair of bit lines extends in the second lateral direction.

7. The semiconductor device of claim 1, wherein the second pair of bit lines further comprises a third portion formed in a third one of the plurality of metallization layers.

8. The semiconductor device of claim 7, wherein the first portion and third portion of each of the second pair of bit lines extend in the first lateral direction, and the second portion of each of the second pair of bit lines extends in the second lateral direction.

9. A semiconductor device, comprising:

a first memory array including a plurality of first memory cells that are formed over a first portion of a substrate, wherein the plurality of first memory cells comprises a first memory cell and a second memory cell;

a second memory array including a plurality of second memory cells that are formed over a second portion of the substrate, wherein the second portion is physically separated from the first portion along a first lateral direction, wherein the plurality of second memory cells comprises a third memory cell and a fourth memory cell;

a first pair of bit lines physically extend across the first portion and terminates at the second portion; and a second pair of bit lines physically extend across both of the first portion and the second portion;

wherein the first pair of bit lines are formed in a first one of a plurality of metallization layers disposed over the substrate, while the second pair of bit lines each have a first portion formed in the first metallization layer and a second portion formed in a second one of the plurality of metallization layers, and wherein the first memory cell is physically arranged next to the second memory cell along a second lateral direction, and the third memory cell is physically arranged next to the fourth memory cell along the second lateral direction, the second lateral direction being perpendicular to the first lateral direction.

10. The semiconductor device of claim 9, wherein the first pair of bit lines are operatively coupled only to the first memory cells, and the second pair of bit lines are operatively coupled only to the second memory cells.

11. The semiconductor device of claim 9, wherein the first memory cells are physically arranged side-by-side along a second lateral direction perpendicular to the first lateral direction, and the second memory cells are physically arranged side-by-side along the second lateral direction.

12. The semiconductor device of claim 11, wherein adjacent one of the first memory cells are operatively coupled to respectively different word lines, and adjacent one of the second memory cells are operatively coupled to respectively different word lines.

13. The semiconductor device of claim 9, wherein at least one portion of each of the first pair of bit lines and the second pair of bit lines are formed in a same one of a plurality of metallization layers disposed over the substrate.

14. The semiconductor device of claim 9, wherein the second pair of bit lines further comprises a third portion formed in a third one of the plurality of metallization layers.

15. The semiconductor device of claim 9, wherein the first and second memory cells are each formed based on a four contacted polysilicon pitch (4CPP) transistor architecture.

16. A method for making memory arrays, comprising:

arranging first and second memory cells over a first portion of a substrate and third and fourth memory cells over a second portion of the substrate, the first portion being separated from the second portion along a first lateral direction, wherein each of the first to four memory cells comprises a plurality of transistors formed based on a four contacted polysilicon pitch (4CPP) architecture;

connecting a first word line and a second word line to the first memory cell and the second memory cell, respectively;

connecting a third word line and a fourth word line to the third memory cell and the fourth memory cell, respectively;

connecting a first pair of bit lines to the first and second memory cells; and connecting a second pair of bit lines to the third and fourth memory cells;

wherein the first pair of bit lines, along the first lateral direction, physically extend across the first portion and terminates at the second portion, and the second pair of bit lines, along the first lateral direction, physically extend across both of the first portion and the second portion;

wherein the first pair of bit lines are formed in a first one of a plurality of metallization layers disposed over the substrate, while the second pair of bit lines each have a first portion formed in the first metallization layer and a second portion formed in a second one of the plurality of metallization layers, and wherein the first and second memory cells are physically arranged next to each other along a second lateral direction perpendicular to the first lateral direction, and the third and fourth memory cells are physically arranged next to each other along the second lateral direction.

17. The method of claim 16, wherein the first and second memory cells belong to a first memory bank, and the third and fourth memory cells belong to a second memory bank.

18. The method of claim 16, wherein the second pair of bit lines further comprises a third portion formed in a third one of the plurality of metallization layers.

19. The method of claim 18, wherein the first portion and third portion of each of the second pair of bit lines extend in the first lateral direction, and the second portion of each of the second pair of bit lines extends in the second lateral direction.

20. The method of claim 16, wherein the first memory cell is aligned with but physically spaced from the third memory cell along the first lateral direction, and the second memory cell is aligned with but physically spaced from the fourth memory cell along the first lateral direction.

\* \* \* \* \*